US006353909B1

(12) United States Patent
Amrany et al.

(10) Patent No.: US 6,353,909 B1
(45) Date of Patent: Mar. 5, 2002

(54) CONFIGURABLE ENCODER AND METHOD FOR GENERATING A REED-SOLOMON CODEWORD

(75) Inventors: Daniel Amrany; Wenwei Pan, both of Ocean Township; William Santulli, Tinton Falls; Yue-Peng Zheng, Ocean Township, all of NJ (US)

(73) Assignee: Globespan, Inc., Red Bank, NJ (US)

( * ) Notice: Subject to any disclaimer, the term of this patent is extended or adjusted under 35 U.S.C. 154(b) by 0 days.

(21) Appl. No.: 09/309,462

(22) Filed: May 11, 1999

(51) Int. Cl.[7] .............................................. H03M 13/15
(52) U.S. Cl. ...................................... 714/757; 714/784
(58) Field of Search .................................. 714/757, 784

(56) References Cited

U.S. PATENT DOCUMENTS

| | | | | |
|---|---|---|---|---|
| 4,852,098 A | * | 7/1989 | Brechard et al. | 371/37 |
| 4,888,778 A | * | 12/1989 | Brechard et al. | 371/37.4 |
| 4,907,233 A | | 3/1990 | Deutsch et al. | 371/37.4 |
| 5,285,455 A | | 2/1994 | Tong et al. | 371/37.5 |

OTHER PUBLICATIONS

Hahn, "Channel Codec Performs Versatile Error–Correction", IEE Proceedings, vol. 137, Pt. E, No. 3, May 1990, pp. 197–201.*

Song et al., "Scheduling Strategies for Low–Energy Programmable Digit–Serial Reed–Solomon Codecs", 1998 IEEE Workshop on Signal Processing Systems, pp. 275–284.*

Wolf, "A DSP Reed–Solomon Coder", IEEE 1999 Custom Integrated Circuits Conference, pp. 541–544.*

Drescher et al., "VLSI Architecture for Datapath Integration of Arithmetic Over GF(2m) on Digital Signal Processors", 1997 IEEE International Conference on Acoustics, Speech, and Signal Processing, pp. 631–634.*

Lin, et al., "Error Control Coding, Fundamentals and Applications," Prentice–Hall, Inc. 1983, pp. 170–176.

Richard A. Blahut, "Theory and Practice of Error Control Codes," Addison=Wesley Publishing Co., Inc., 1983 pp. 174–191.

* cited by examiner

*Primary Examiner*—Stephen M. Baker
(74) *Attorney, Agent, or Firm*—Thomas, Kayden, Horstemeyer & Risley

(57) ABSTRACT

Disclosed is a configurable Reed-Solomon encoder and method. The configurable Reed-Solomon encoder comprises a multiplexed multiplier-accumulator, a parallel latch bank operatively coupled to the multiplexed multiplier-accumulator, a data/parity multiplexer coupled to the parallel latch bank, and an encoder controller operatively coupled to, and controlling the operation of, the multiplexed multiplier-accumulator, the parallel latch bank, and the data/parity multiplexer. The configurable Reed-Solomon encoder is preferably implemented in an application specific integrated circuit (ASIC), although it may be implemented in software executed by a high-speed digital signal processor, etc.

15 Claims, 4 Drawing Sheets

CONFIGURABLE ENCODER AND METHOD FOR GENERATING A REED-SOLOMON CODEWORD

CROSS-REFERENCE TO RELATED APPLICATIONS

Not applicable.

TECHNICAL FIELD

The present invention is generally related to data communications and, more particularly, is related to a Reed-Solomon ("RS") encoder and method for minimizing or eliminating errors in data communication.

BACKGROUND OF THE INVENTION

Communication of information in the form of digital data is quite commonplace in today's society. There are many different communications channels that may be employed to facilitate such data communication. Such channels may include existing telecommunications networks, the air, optical fiber networks, or other like media. It is often the case that the communications channels chosen do not provide a perfect medium to transfer data information, and for various reasons such as noise, interference, or other phenomena, errors may be introduced into the data stream transmitted across a particular channel.

Many different approaches have been proposed to either reduce or eliminate errors in data communications. One such approach is to employ Reed-Solomon encoding. When employing Reed-Solomon encoding, data is transmitted in codewords which include a number of parity symbols along with the original data symbols. The parity symbols are generated using a Reed-Solomon encoder. These parity symbols may be employed to correct errors in a received data signal.

When using Reed-Solomon encoding, a number 2t of parity symbols may be generated to allow a data system to correct up to t possible errors in the transmitted data. However, for each different number of total parity symbols generated, there is a unique Reed-Solomon generator polynomial with a specific number of coefficients employed. Thus, the typical Reed-Solomon encoder creates a specific number of parity symbols, which limits its usefulness if more or less parity symbols are desired.

SUMMARY OF THE INVENTION

The present invention provides a configurable Reed-Solomon encoder and method that addresses the above concerns. In one embodiment, the configurable Reed-Solomon encoder comprises a distributed multiply accumulator, a parallel latch bank operatively coupled to the distributed multiply accumulator, a data/parity multiplexer coupled to the parallel latch bank, and an encoder controller operatively coupled to, and controlling the operation of, the distributed multiply accumulator, the parallel latch bank, and the data/parity multiplexer. The configurable Reed-Solomon encoder is preferably implemented in an application specific integrated circuit (ASIC), although it may be implemented in software executed by a high-speed digital signal processor, etc.

The present invention can also be viewed as providing a method for generating a Reed-Solomon codeword. Broadly stated, the method comprises the steps of: generating a parity symbol output with a multiply accumulator, distributing the operation of the multiply accumulator among a number of parallel latches, and generating a data output from a data input and a number of parity symbols stored in the parallel latches.

A significant advantage of the present invention is that it is highly configurable to implement Reed-Solomon encoding for different data communications protocols, etc. Specifically, the Reed-Solomon encoder of the present invention may be configured to generate a number of parity symbols for Reed-Solomon codewords of a particular length constrained by a Galois field of $2^m$, where m is the number of bits per symbol. The present invention is also economical in that it requires a minimum number of logical components to implement and consumes less power, while at the same time being highly configurable. Other advantages of the invention are that it is simple in design, user friendly, robust and reliable in operation, and easily implemented for mass commercial production.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
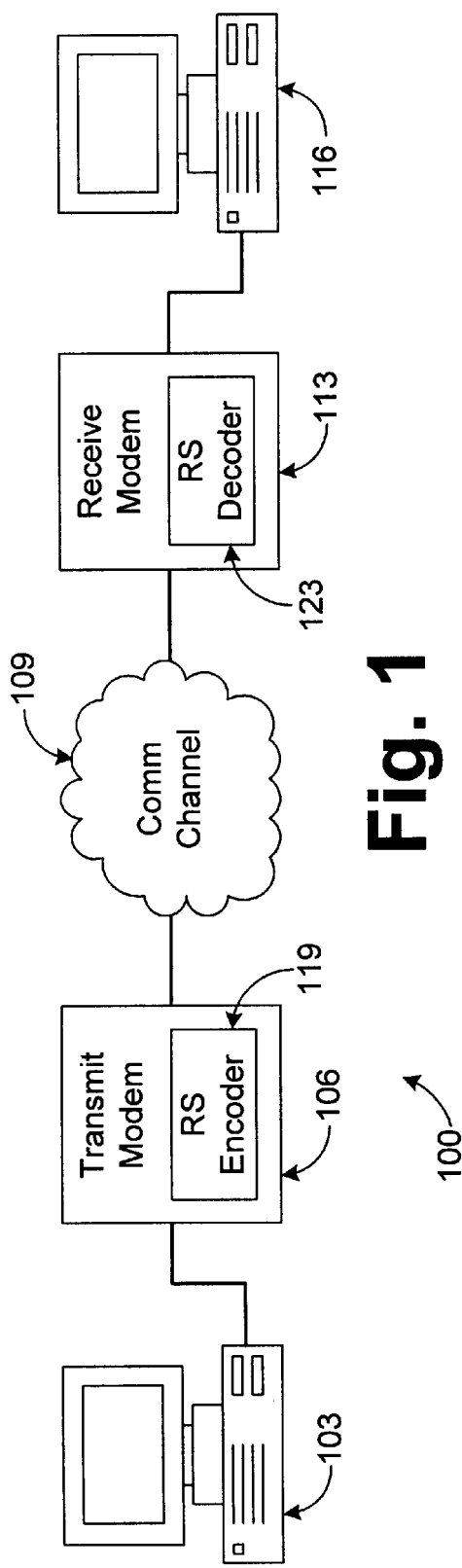
FIG. 1 is a block diagram of a data communications system according to an embodiment of the present invention.

With reference to FIG. 1, shown is a data communications system 100 according to an embodiment of the present invention. The data communications system 100 includes a first data terminal device 103 which is coupled to a transmit modem 106. The transmit modem 106 is, in turn, coupled to a communications channel 109. The communications channel 109 is coupled to receive modem 113 that is coupled, in turn, to a second data terminal device 116. The transmit modem 106 includes a Reed-Solomon (RS) encoder 119 and the receive modem 113 includes a RS decoder 123.

The first and second data terminal devices 103 and 116 may be, for example, computer systems, workstations, or other devices that may transmit or receive data. The communications channel 109 may be, for example, telecommunications networks, the Internet, a local area network (LAN), a wide area network, or other similar network which employ various mediums such as copper wire, optical fibers, air, etc.

During operation of the data communications system 100, the first data terminal device 103 generates data to transmit to the second data terminal device 116. The first data terminal device 103 applies the data to the transmit modem 106 which modulates the data for transmission across the communications channel 109. The transmit modem 106 also encodes the data using the RS encoder 119 into n symbol codewords. The n symbol codewords are transmitted across the communications channel 109 and are applied to the receive modem 113 which recovers the transmitted data using the RS decoder 123. Thereafter, the data is applied to the second data terminal device 116. Although the operation of the data communications system 100 is described as being unidirectional, it is understood that the data communications system 100 may be bi-directional where the modems 106 and 113 both transmit and receive data across the communications channel 109 and employ both RS encoding and decoding. Next, a brief explanation of Reed-Solomon encoding is offered in order to properly explain the various features of the present invention.

Figure 2:
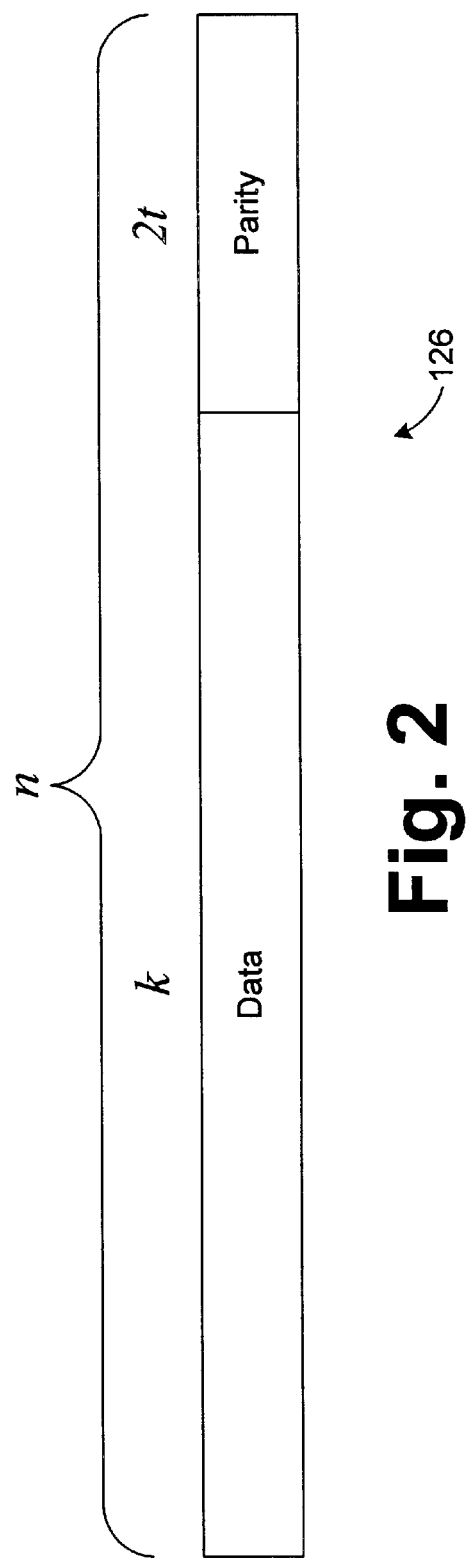
FIG. 2 is a drawing of an Reed-Solomon codeword transmitted by the data communications system of FIG. 1.

With reference to FIG. 2, shown is an n symbol codeword 126 that is created using Reed-Solomon encoding. The n symbol codeword 126 comprises k data symbols of s bits each with n−k parity symbols of s bits each added thereto. The total number of parity symbols is equal to 2t, where 2t=n−k. The n symbol codeword 126 may be referred to as a systematic code because the data is left unchanged and the parity symbols are appended. Reed-Solomon codes provide a significant advantage in that they can correct any number of symbol errors less than or equal to t in the n symbol codeword 126. Given a symbol size s, which is defined as a number of bits per symbol, the maximum codeword length n for a Reed-Solomon code is n=$2^s$−1. Generally, the amount of processing power required to encode and decode Reed-Solomon codes is related to the number of parity symbols per n symbol codeword. A large value for t translates into the ability to correct a large number of errors in the received n symbol codeword, but correspondingly requiring more computational power than would be the case if t were smaller.

A Reed-Solomon n symbol codeword 126 is generated using a generator polynomial, where all valid codewords are exactly divisible by the generator polynomial. The form of the generator polynomial is given by $$g(x)=(x-\alpha^i)(x-\alpha^{i+1}) \ldots (x-\alpha^{i+2t-1}),$$

and the n symbol codeword 126 is generated using $$c(x)=g(x)i(x),$$

where g(x) is the generator polynomial, i(x) is the information or data block, and c(x) is a valid n symbol codeword 126, and a is referred to as a primitive element of the field. The 2t parity symbols in the n symbol codeword 126 are given by $$p(x)=i(x)x^{x-k} \mod g(x).$$

Figure 3:
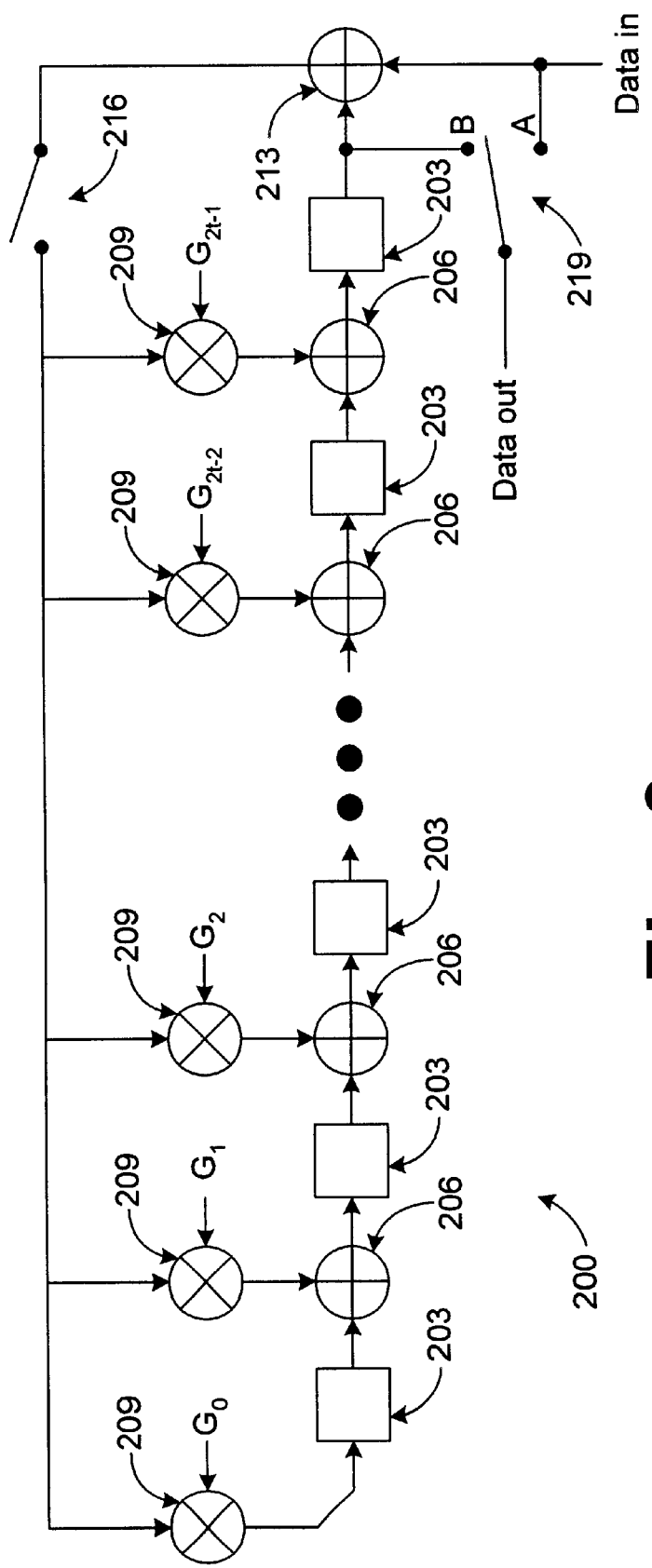
FIG. 3 is a schematic of a conventional Reed-Solomon encoder.

Turning to FIG. 3, shown is a block diagram of an architecture of an RS encoder 200. The RS encoder 200 includes a number of registers 203 in a bit shift arrangement, a number of adders 206, and a number of multipliers 209. The adders 206 are placed between the registers 203 and the output of each adder 206 is applied to the adjacent register 203 to the right. The two inputs applied to the adders 206 include a value from the previous register 203 to the left of the respective adder 206 and a value from a respective multiplier 209. The two inputs applied to the multipliers 209 include a feedback value and a respective polynomial coefficient $G_i$.

The feedback value is generated by a feedback/input adder 213 that includes a value from the rightmost register 203 and a data value as its inputs. The output of the feedback/input adder 213 is applied to a switch 216 which regulates when the output of the feedback/input adder 213 is applied to the multipliers 209. In addition, the output from the leftmost multiplier 209 is applied directly to the leftmost register 203 without the addition performed. Note that together, respective groups of multipliers 209, adders 206, and registers 203 create a multiply accumulator.

The RS encoder 200 also includes an output switch which toggles between the input data and the output of the rightmost adder 203, depending upon whether the data output is the data symbols or parity symbols. Note that the output switch 219 is in the "A" position when data symbols are transmitted and the output switch 219 is in the "B" position when parity symbols are transmitted. In similar fashion, when the data output comprises the data symbols, the switch 216 is closed, thereby resulting in the multiply accumulation of the parity symbols in the registers 203. When the data output comprises the parity symbols, the switch 216 is open so that the registers 203 act as a bit shift register that shifts out the accumulated parity symbols stored in the registers 203.

To describe the operation of the RS encoder 200, data values are applied to the feedback/input adder 213, generating an output that is fed back to the multipliers through the switch 216. The multipliers 209 and corresponding adders 206 apply a new value into the corresponding registers 203 accordingly. Note that the output of the leftmost multiplier 209 is applied directly to the leftmost register 203. During this period of operation, the output switch 219 is in the "A" position which cause the symbols of the data input to be passed directly to the data output and parity symbols are accumulated in the registers 203. When k data symbols have been fed into the RS encoder 200, the output switch 219 moves to the "B" position and the switch 216 opens. At this point, the registers 203 now contain the parity symbols and are emptied by shifting the parity symbols out of the registers 203 as the data output. In this manner, a Reed-Solomon codeword is generated. Note that the number of generator coefficients $G_i$ employed by the RS encoder 200 is equal to 2t, as previously stated.

Figure 4:
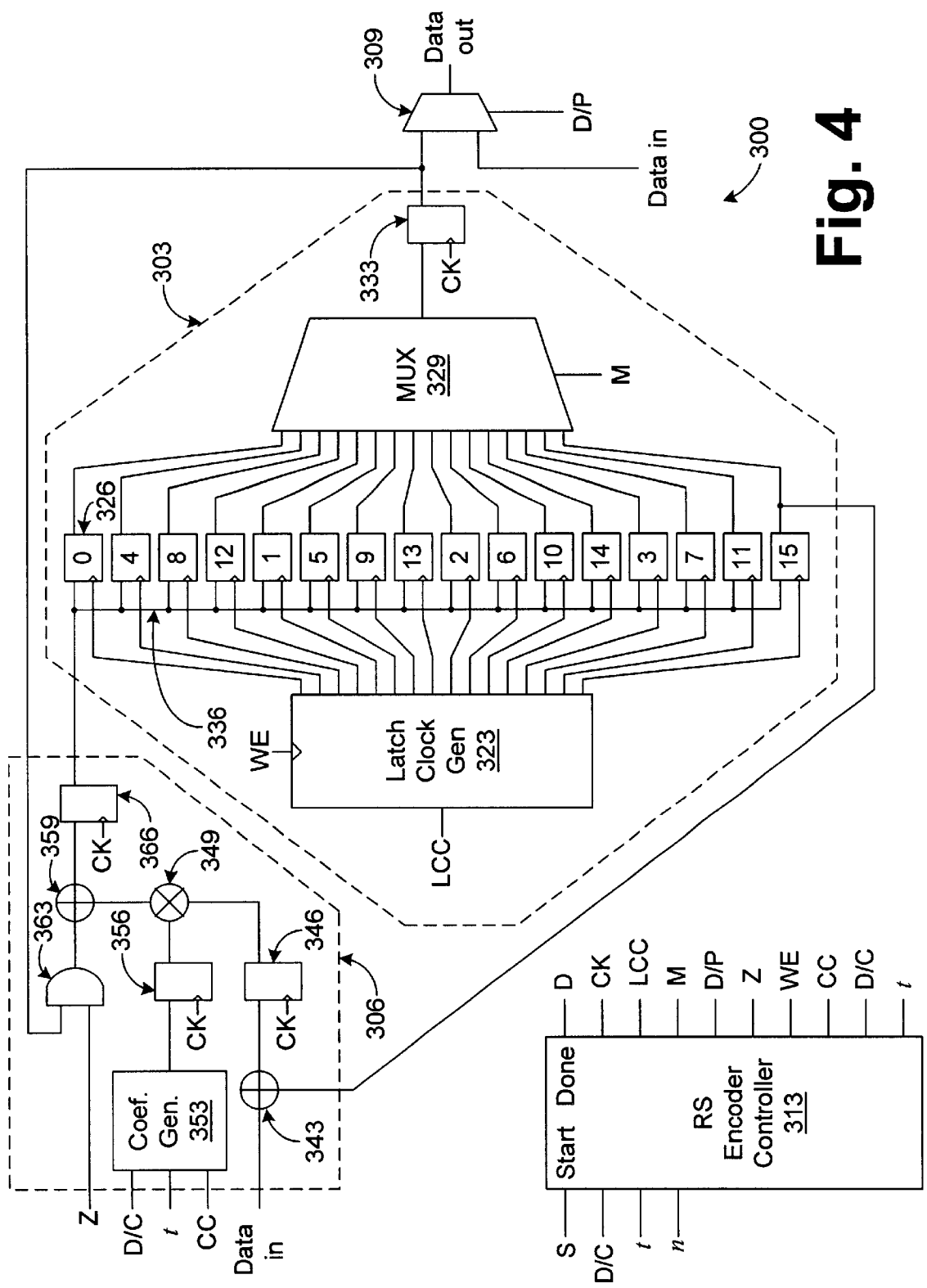
FIG. 4 is a schematic of a Reed-Solomon encoder according to an embodiment of the present invention.

With reference to FIG. 4, shown is a schematic of an RS encoder 300 according to an embodiment of the present invention. The RS encoder 300 includes a parallel latch bank 303, a multiplexed multiplier-accumulator 306, an output multiplexer 309, and an RS encoder controller 313. The parallel latch bank 303 includes a latch clock generator 323 with two inputs, namely a write enable WE and a latch clock control LCC, as well as a number of latching outputs. The parallel latch bank 303 also includes a number of parallel latches 326, each parallel latch 326 having an input, a latching input, and an output. Each of the latching outputs of the latch clock generator are applied to a corresponding latching input of one of the parallel latches 326. The parallel latch bank 303 also includes a latch multiplexer 329 having a number of inputs to which the outputs of the parallel latches 326 are applied. The inputs of each of the parallel latches 326 are all coupled to a common distribution bus 336. The output of the latch multiplexer 329 is applied to an output register 333 which, in turn, is coupled to an input of the output multiplexer 309.

The multiplexed multiplier-accumulator 306 comprises a feedback/data adder 343 having a data input and a feedback input. The feedback input is coupled to an output of the last parallel latch 326 in the parallel latch bank 303. The output of the feedback/data adder 343 is applied to a first register 346, which in turn, applies the same to an input of a multiplier 349. The multiplier 349 has a second input which is coupled to a coefficient generator 353 via a second register 356. The output of the multiplier 349 is applied to an adder 359.

The multiplexed multiplier-accumulator 306 receives a previous latch signal from the output register 333 of the parallel latch bank 303 which is applied to an AND gate 363 in the multiplexed multiplier-accumulator 306. A zero input is applied to second input of the AND gate 363. The output of the AND gate 363 is applied to the adder 359. The output of the adder 359 is coupled to the common distribution bus through a third register 366.

The output multiplexer 309 includes a data input in addition to the input coupled to the output register 333. The output multiplexer 309 includes a data output from which the n symbol codewords 126 are transmitted.

Finally, the RS encoder controller 313 controls the operation of the multiplexed multiplier-accumulator 306, the parallel latch bank 303, and the output multiplexer 309. The RS encoder controller 313 includes a start input S, a modulation type input D/C, an error correction capability input t, and a codeword length input n. The modulation type input D/C is provided by the user to configure the RS encoder 300 for a particular modulation type such as, for example, Discrete Multi-tone modulation (DMT), Carrierless Amplitude-Phase (CAP), or Quadrature Amplitude Modulation (QAM) which is a superset of CAP, or other types of modulation. The error correction capability input t allows the RS encoder 300 to be configured for different numbers of parity symbols in each n symbol codeword 126. The codeword length input n allows length of the n symbol codewords 126 to be configured by the user. The start input S is triggered by external circuitry which interfaces with the RS encoder 300.

The RS encoder controller 313 includes several outputs such as a done output D, a clock signal CK, an multiplexer control signal M, a coefficient generator counter signal CC, a previous latch control signal Z, a write enable signal WE, a data/parity control signal D/P, a modulation type output D/C, and an error correction capability output t. The RS encoder controller 313 also comprises state circuitry that generates appropriate signals at the several outputs to control the operation of the RS encoder 300, based upon the input configuration specified by the user. Note that the done output D is set to a logical "1" when the last symbol per n symbol codeword 126 is processed.

Next, the operation of the RS encoder 300 is discussed. In order to generate an n symbol codeword 126, the output multiplexer 309 is set to apply the k data input symbols to the data output with an appropriate data/parity control output D/P. While the k data input symbols are transmitted from the output multiplexer 309, the same k data symbols are applied to the multiplexed multiplier-accumulator 306 which accumulates the 2t parity symbols in the parallel latches 326. When k data symbols have been applied to the multiplexed multiplier-accumulator 306, the output multiplexer 309 is set to transmit the parity symbols from the output register 333 using an appropriate data/parity control output D/P from the RS encoder controller 313. The accumulated parity symbols are then transferred from the parallel latches 326 through the latch multiplexer 329 to the output register 333 and the output multiplexer 309.

The parallel latches 326 are numbered from 0 to 15 where the "first" parallel latch is number 0 and the so called "last" parallel latch is number 15. It is a significant advantage that the RS encoder 300 is configurable for different numbers of 2t parity symbols, depending upon how many errors the user may wish to correct by choosing a specific value for the error correction capability input t. As shown, there are sixteen total parallel latches 326 in the parallel latch bank 303, although it is possible that more or less parallel latches 326 may be used, whereas the sixteen shown are for purposes of illustrating the present invention.

The actual parallel latches 326 employed to generate a given number of parity symbols begin with the last parallel latch 326 which is the 15th latch. Thus, for example, if the error correction capability input t is set to 2, then the total number of parity symbols will be 2(2)=4. In this case, parallel latches 326 numbered 12, 13, 14, and 15, (i.e. the "$12^{th}$, $13^{th}$, $14^{th}$, and $15^{th}$ parallel latches 326) become active and are employed to accumulate the desired parity symbols. The reason the last parallel latches are used first is because the last or $15^{th}$ parallel latch 326 provides the feedback to the multiplexed multiplier-accumulator 306. To provide another example, suppose the total number of parity symbols is to be 2(4)=8. In such a case, the $8^{th}$ through the $15^{th}$ parallel latches 326 are employed to accumulate the 8 parity symbols. Thus, the RS encoder 300 of the present invention provides a significant advantage in that that the same circuit can be configured to generate different numbers of parity symbols as dictated by the user.

Next, the coordinated operation of the multiplexed multiplier-accumulator 306 and the parallel latch bank 303 in accumulating the parity symbols in the parallel latches 326 is described. The multiplexed multiplier-accumulator 306 is set to generate a value to be placed in one of the parallel latches 326 beginning with the lowest active parallel latch 326. For example, if the number of parity symbols to be generated is four, then the lowest active parallel latch 326 is the $12^{th}$ parallel latch 326.

Beginning with the multiplexed multiplier-accumulator 306, both a data symbol and a feedback value are applied to the feedback/data adder 343. Note that the feedback value is received from the $15^{th}$ or last parallel latch 326. The feedback/data adder 343 generates an output that is placed in the first register 346.

At the same time, the coefficient generator 353 receives the coefficient generator counter output CC from the RS encoder controller 313 that causes the coefficient generator 353 to generate a specific corresponding polynomial coefficient $G_i$, the polynomial coefficients being the same as those discussed previously. In the preferred embodiment, the coefficient generator 353 is a programmable logic array that generates any one of a number of coefficients based upon the coefficient generator counter output CC. The coefficient generator 353 also receives the modulation type output D/C and the error correction capability t to determine how many total coefficients are to be generated, as well as the modulation scheme for which they are generated as these factors will bear on the precise coefficients necessary for proper RS encoding.

The coefficient generator 353 is a logic lookup table with different coefficient banks for different sets of coefficients depending upon the modulation type and error correction capability t specified by the user. The coefficient generator 353 may be, for example, a programmable logic array that can be created by using any logic synthesis tool.

Thus, the coefficient generator 353 generates the polynomial coefficients in real time as needed depending upon the particular parallel latch 326 for which a particular multiply accumulation function is being performed. In other words, the coefficient generator 353 receives the coefficient generator counter output CC which tracks the particular generator polynomial coefficient to be generated, the total number of coefficients being equal to 2t. The polynomial coefficient generated is applied to the second register 356.

The values held by the first and second registers 346 and 356 are applied to the multiplier 349 which generates an output that is applied to the adder 359. The adder 359 also receives a previous latch value from the output register 333 that received the same from the latch multiplexer 329. The RS encoder controller 313 causes the value held by a previous latch to be sent to the adder 359 by applying an appropriate control input M to the latch multiplexer 329. The previous latch value is applied to the adder 359 via the AND gate 363. The AND gate 363 functions to provide the previous latch value to the adder 359 when the previous latch control signal Z is set to a logical "1". When the previous latch control signal Z is set to a logical "0", then the previous latch value is not applied to the adder 359 that, consequently, passes the value received from the multiplier 349 to the common distribution bus 336. The value received from the multiplier 349 is passed through when the distributed multiply accumulator is generating a value to be placed in the lowest active parallel latch 326 which reflects the fact that there is no "previous latch" for the lowest active parallel latch 326. In all other cases, the previous latch control signal Z is set to a logical "1" where a value held by the parallel latch 326 which is prior to the parallel latch 326 for which a current value is being calculated is applied to the adder 359.

The value generated by the adder 359 is applied to the common distribution bus 336 via the third register 366. This value is written to the appropriate parallel latch 326 based upon the state of the latch clock control LCC and the write enable signal WE applied to the latch clock generator. The latch clock control LCC determines which of the outputs is to be set to a logical "1" and the write enable WE causes this output to be set high for a specific period of time, thereby causing the current value on the common distribution bus 336 to be written to the corresponding parallel latch 326.

After a particular parallel latch 326 has been updated, the RS encoder controller 313 moves on to the next parallel latch 326 with each new data symbol received until k data symbols have been processed. Thus, the RS encoder 300 will continue to calculate and distribute values from the lowest active parallel latch 326, whichever it may be, to the last or $15^{th}$ parallel latch again and again as long as data symbols are received up until the $k^{th}$ data symbol. At this time, the values held by the active parallel latches 326 contain the parity symbols which are included in the n symbol codeword 126. Thereafter, the RS encoder controller sets the data/parity signal D/P to allow the values in the output register 333 to be transmitted as the data output. Also, the RS encoder controller 313 causes the latch multiplexer 329 to write the parity symbols from the appropriate active parallel latches 326 to the output register 333 using the multiplexer control signal M and the clock signal CK. Thereafter, the output multiplexer 309 is set to allow the data values to be transmitted and the process starts all over again to generate a new n symbol codeword.

Figure 5:
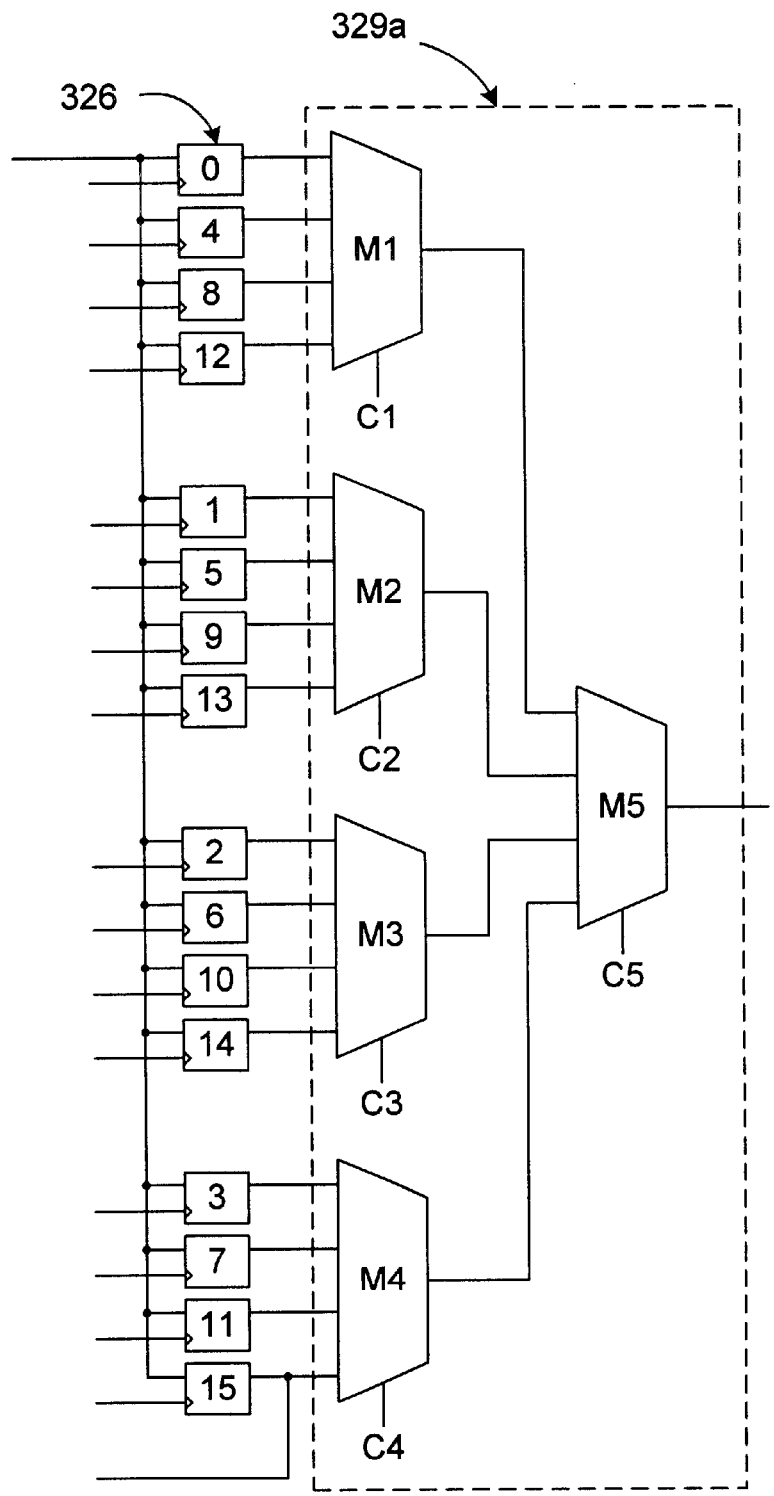
FIG. 5 is a schematic of a power saving multiplexer configuration employed in the Reed-Solomon encoder of FIG. 4.

Referring to FIG. 5, shown is a multiplexer configuration 329a in which five four-to-one multiplexers M1, M2, M3, M4, and M5 are employed in the place of the latch multiplexer 329 (FIG. 4). Each of the multiplexers M1–M5 include a two bit control input C1, C2, C3, C4, and C5 respectively. The parallel latches 326 are arranged in a manner similar to the parallel latches 326 of the parallel latch bank 303 (FIG. 4). The multiplexer configuration 329a is a low power consumption configuration because the switching required in multiplexers M1–M4 is minimized by arranging the parallel latches 326 in the order noted. For example, if t=2, then parallel latches 12, 13, 14, and 15 are employed. In this example, only the multiplexer M5 need be switched during the encoding process, thereby saving power that would be consumed by the multiplexers M1–M4 to switch appropriately had the parallel latches 326 been arranged in a consecutive order, for example, from top to bottom. Switching is reduced in a similar manner for any value of t as well.

Turning back to FIG. 4, the RS encoder 300 also provides several advantages, including the fact that the circuit is much smaller than conventional designs, requiring less power to operate and a smaller footprint to accommodate other circuitry on a single integrated circuit such as an ASIC or similar chip technology. The RS encoder 300 advantageously uses a single clock CK that is much easier to route on the integrated circuit due to the design of the parallel latch bank 303, thereby alleviating any potential skew problems. The RS encoder 300 is also fully configurable to any error correction capability t in addition to being configurable for different modulation schemes. The present invention advantageously accomplishes these features without the use of any random access memory (RAM) and the associated circuitry to control and interface with such a RAM. Therefor, the present invention features a smaller area or footprint by removing the overhead associated with such a RAM. As a consequence, the present invention may be employed by many different users without need for a change in the logic circuitry.

Finally, the RS encoder 300 is preferably implemented in hardware, in an application specific integrated circuit (ASIC) or other integrated circuit. It is also possible that the RS encoder 300 may be implemented in a dedicated circuit mounted on a printed circuit board or the like using standard available digital logic components, etc. In addition, the RS encoder 300 may also be implemented in software executed on a high speed digital signal processor, or a combination of software executed on a processor working in conjunction with specific dedicated logical circuits. All such implementations are included herein.

Many variations and modifications may be made to the above-described embodiment(s) of the invention without departing substantially from the spirit and principles of the invention. All such modifications and variations are intended to be included herein within the scope of the present invention.

Therefore, having thus described the invention, at least the following is claimed:

1. A configurable Reed-Solomon encoder, comprising:
    a multiplexed multiplier-accumulator further comprising a first adder and a second adder;
    a parallel latch bank operatively coupled to the multiplexed multiplier-accumulator;
    a data/parity multiplexer coupled to the parallel latch bank; and
    an encoder controller operatively coupled to, and controlling the operation of, the multiplexed multiplier-accumulator, the parallel latch bank, and the data/parity multiplexer.

2. The encoder of claim 1, wherein the encoder is configurable to generate a user specified number of parity symbols for a user specified number of data symbols.

3. The encoder of claim 1, wherein the multiplexed multiplier-accumulator further comprises an RS coefficient generator circuit.

4. The encoder of claim 1, wherein the parallel latch bank further comprises:
   a number of parallel latches, each parallel latch having a data input coupled to a distributed output of the multiplexed multiplier-accumulator;
   a latch clock generator having a number of latching outputs, the latching outputs being coupled to a number of write enable inputs on the parallel latches, respectively; and
   an output multiplexer having a number of multiplexer inputs, each of the multiplexer inputs being coupled to a data output of one of the parallel latches.

5. The encoder of claim 1, wherein the encoder controller further comprises a symbol correction input to configure the encoder to provide for the correction of a predetermined number of erroneous symbols t in a transmitted codeword.

6. The encoder of claim 1, wherein the encoder controller further comprises a codeword length input to configure the encoder to generate a number of codewords having n symbols.

7. The encoder of claim 1, wherein the encoder controller further comprises a code parameter type input to configure the encoder to perform a Reed/Solomon encoding function for one of at least two coefficient generation schemes.

8. A configurable Reed-Solomon encoder, comprising:
   a multiplexed multiplier-accumulator;
   a parallel latch bank operatively coupled to the multiplexed multiplier-accumulator;
   a data/parity multiplexer coupled to the parallel latch bank; and
   an encoder controller operatively coupled to, and controlling the operation of, the multiplexed multiplier-accumulator, the parallel latch bank, and the data/parity multiplexer, wherein the multiplexed multiplier-accumulator further comprises:
   a coefficient generator;
   a first adder having a feedback input coupled to the parallel latch bank and a data input;
   a multiplier having a first input coupled to an output of the coefficient generator and a second input coupled to an output of the first adder;
   a second adder having an input coupled to an output of the multiplier, a previous latch input coupled to the parallel latch bank, and an output coupled to the parallel latch bank.

9. A configurable Reed-Solomon encoder, comprising:
   a multiplexed multiplier-accumulator;
   a parallel latch bank operatively coupled to the multiplexed multiplier-accumulator;
   a data/parity multiplexer coupled to the parallel latch bank; and
   an encoder controller operatively coupled to, and controlling the operation of, the multiplexed multiplier-accumulator, the parallel latch bank, and the data/parity multiplexer, wherein the coupling between the parallel latch bank and the multiplexed multiplier-accumulator further comprises:
   a feedback coupling;
   a previous latch coupling; and
   a distributed accumulator output coupling.

10. A configurable Reed-Solomon encoder, comprising:
    a multiplexed multiplier-accumulator configured to generate a multiplier-accumulator output signal;
    a parallel latch bank, the parallel latch bank being configured to generate a feedback output signal, a previous latch signal, and a latch bank output signal, the feedback output and the previous latch signals being applied to the multiplexed multiplier-accumulator, the multiplier-accumulator output signal being applied to the parallel latch bank;
    a data/parity multiplexer configured to receive the latch bank output signal and a data signal, the data/parity multiplexer applying one of the latch bank output signal and the data signal to an encoder output; and
    an encoder controller operatively coupled to, and controlling the operation of, the multiplexed multiplier-accumulator, the parallel latch bank, and the data/parity multiplexer.

11. A configurable Reed-Solomon encoder, comprising:
    a multiplexed multiplier-accumulator;
    parallel means for maintaining a number of parity symbols and for distributing an operation of the multiplexed multiplier-accumulator among the parity symbols;
    means for toggling between a data symbol output and a parity symbol output; and
    means for controlling the operation of the multiplexed multiplier-accumulator, the parallel means, and the data/parity multiplexer.

12. A method for generating a Reed-Solomon codeword, comprising the steps of:
    generating a parity symbol output with a multiplexed multiplier-accumulator;
    distributing the operation of the multiplexed multiplier-accumulator among a number of parallel latches; and
    generating a data output from a data input and a number of parity symbols stored in the parallel latches.

13. The method of claim 12, further comprising the step of generating a number of Reed-Solomon polynomial coefficients.

14. The method of claim 12, wherein the step of distributing the operation of multiplier-accumulator further comprises the steps of:
    applying the parity signal output of the multiplier-accumulator to a number of latches; and
    selectively latching the parity signal output into the latches.

15. The method of claim 12, wherein the step of distributing the operation of the multiply accumulator further comprises the steps of:
    applying the parity signal output of the multiply accumulator to a number of latches; and
    selectively latching the parity signal output into the latches.

* * * * *